United States Patent
Farooq et al.

(10) Patent No.: US 7,875,806 B2
(45) Date of Patent: Jan. 25, 2011

(54) STRUCTURE AND METHOD TO GAIN SUBSTANTIAL RELIABILITY IMPROVEMENTS IN LEAD-FREE BGAS ASSEMBLED WITH LEAD-BEARING SOLDERS

(75) Inventors: Muta G. Farooq, Hopewell Junction, NY (US); Charles C. Goldsmith, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/706,418

(22) Filed: Feb. 16, 2010

(65) Prior Publication Data
US 2010/0139958 A1    Jun. 10, 2010

Related U.S. Application Data

(60) Division of application No. 11/759,298, filed on Jun. 7, 2007, now Pat. No. 7,731,077, and a continuation of application No. 10/711,461, filed on Sep. 20, 2004, now Pat. No. 7,287,685.

(51) Int. Cl.
    *H05K 1/09*   (2006.01)
(52) U.S. Cl. .................. 174/257; 29/843; 257/737
(58) Field of Classification Search ............... 174/257, 174/260; 361/760; 29/843; 257/737–738
See application file for complete search history.

(56) References Cited

U.S. PATENT DOCUMENTS

| | | | |
|---|---|---|---|
| 4,673,772 A | | 6/1987 | Satoh et al. |
| 5,551,627 A | | 9/1996 | Leicht et al. |
| 5,796,591 A | | 8/1998 | Dalal et al. |
| 5,803,340 A | * | 9/1998 | Yeh et al. ............ 228/56.3 |
| 5,965,197 A | * | 10/1999 | Jin et al. ............ 427/180 |
| 6,609,651 B1 | * | 8/2003 | Borneman ............ 228/245 |
| 6,702,175 B1 | | 3/2004 | Matsushige et al. |
| 6,779,710 B2 | | 8/2004 | Igarashi et al. |

(Continued)

FOREIGN PATENT DOCUMENTS

EP      0177042 A    4/1986

OTHER PUBLICATIONS

Solder Joint Formation With Sn-Ag-Cu and Sn-Pb Solder BAI Pastes, Polina Snugovsky et al., Clestica International, Inc.; SMTA, Dec. 31, 2003; www.smta.org/knowledge/proceedings_abstract.cfm?PROCEEDING_ID+1128.

*Primary Examiner*—Jeremy C Norris
(74) *Attorney, Agent, or Firm*—DeLio & Peterson, LLC; Kelly M. Nowak; Joseph Petrokaitis

(57) ABSTRACT

Methods of forming and assemblies having hybrid interconnection grid arrays composed of a homogenous mixture of Pb-free solder joints and Pb-containing solder paste on corresponding sites of a printed board. The aligned Pb-free solder joints and Pb-containing solders are heated to a temperature above a melting point of the Pb-free solder joint for a sufficient time to allow complete melting of both the Pb-free solder joints and Pb-containing solder paste and the homogenous mixing thereof during assembly. These molten materials mix together such that the Pb from the Pb-containing solder disperses throughout substantially the entire Pb-free solder joint for complete homogenization of the molten materials to form the homogenous hybrid interconnect structures of the invention.

20 Claims, 2 Drawing Sheets

U.S. PATENT DOCUMENTS

| | | |
|---|---|---|
| 6,861,346 B2 * | 3/2005 | Tong et al. .................. 438/613 |
| 7,145,236 B2 | 12/2006 | Miura et al. |
| 2002/0149113 A1 | 10/2002 | Ray et al. |
| 2004/0108367 A1 | 6/2004 | Farooq et al. |
| 2005/0224966 A1 | 10/2005 | Fogel et al. |
| 2008/0206979 A1 | 8/2008 | Fpgel et al. |

* cited by examiner

# STRUCTURE AND METHOD TO GAIN SUBSTANTIAL RELIABILITY IMPROVEMENTS IN LEAD-FREE BGAS ASSEMBLED WITH LEAD-BEARING SOLDERS

BACKGROUND OF THE INVENTION

1. Field of the Invention

The present invention relates to the manufacture of electronic modules, and in particular, to methods of attaching electronic components to each other using Pb-free solder interconnections in combination with Sn/Pb or Pb-containing paste to provide a soldered article with acceptable and reliable levels of thermo-mechanical fatigue.

2. Description of Related Art

The use of solder to join materials such as components of an electronic structure is well known in the art. In the electronics area there are a myriad of electronic components that require connection to other electronic components or to other levels of packaging. Examples include mounting of integrated circuit chips to a metallized substrate, multi-layer ceramic substrate (MLC), laminate organic substrate, glass ceramic substrate, card (direct-chip-attach, DCA), printed circuit board (PCB) and any substrate made of composite materials meeting thermal and mechanical properties.

Conventionally, Sn—Pb type solder interconnections, having low tensile modulus, are used to join electronic components, such as substrates to electronic PCBs or cards. However, since these Sn—Pb type solder interconnections contain poisonous Pb, there has been an increasing number of cases in which the use thereof is restricted. To address these problems, trends have been leaning towards the use of interconnections composed of Pb-free solders for joining substrates to electronic PCBs. Several Pb-free solders have been identified for replacing Pb-containing solder interconnections in microelectronic applications, some of which include Sn-3.5Ag (SA), Sn-3.5Ag-0.7Cu (SAC), Sn-3.5Ag-4.8Bi (SAB), and Sn-0.7Cu (SC) (with slight variations in compositions).

As the interconnect industry diverges away from the use of Sn—Pb type solder interconnections, and towards Pb-free interconnections, there remains a period during which the use of a Sn—Pb type solder paste (or flux) will still be required for joining the Pb-free interconnections to the electronic PCBs due to the materials thereof. However, attempts at attaining a sufficient and acceptable level of thermo-mechanical fatigue reliability for these hybrid or mixed assemblies has not generally been successful.

Accordingly, during this interim period, there exists a need in the art for providing improved methods for connecting Pb-free interconnections to electronic PCBs using a Sn—Pb type solder paste (or flux) for forming a soldered article having superior reliability in the mixed (hybrid) assembly.

SUMMARY OF THE INVENTION

Bearing in mind the problems and deficiencies of the prior art, it is therefore an object of the present invention to provide methods for connecting Pb-free interconnections to electronic PCBs using a Pb-containing solder.

It is another object of the present invention to provide a soldered article having superior reliability at a soldered mixture of a Pb-free interconnections and a Pb-containing solder.

A further object of the invention is to provide methods for making, and the soldered articles formed, having hybrid interconnects with acceptable and reliable levels of thermo-mechanical fatigue.

It is yet another object of the present invention to provide methods of making soldered articles having reliable hybrid interconnects in an easy, efficient and inexpensive manner.

Still other objects and advantages of the invention will in part be obvious and will in part be apparent from the specification.

The above and other objects, which will be apparent to those skilled in art, are achieved in the present invention, which is directed to a method of forming an interconnect structure by providing a lead free solder joint, providing a lead-containing solder and then aligning the lead free solder joint with the lead-containing solder. The aligned lead free solder joint and lead-containing solder are heated to a temperature above a melting point of the lead free solder joint for a sufficient time to allow for complete homogenization of the lead free solder joint with the lead-containing solder. This forms a homogenous hybrid interconnect structure of the invention.

In the invention, the lead free solder joint may be a solder ball or a solder column, and may be compose of a material including, but not limited to, Sn—Ag (SA), Sn—Ag—Sb, Sn—Ag—Bi, Sn—Ag—Cu (SAC), Sn—Ag—Cu—Sb, Sn—Ag—Cu—Bi, Sn—Ag—Bi—Sb, Sn—Cu (SC), Sn—Cu—Sb, Sn—Cu—Bi and combinations thereof. Alternatively, the lead free solder joint may be compose of a material including, but not limited to, Sn—Zn, Sn-Zi-Bi, Sn—In, Sn—Bi, Sn—Ag—In, Sn—Ag—In—Cu or combinations thereof. The lead-containing solder may be a lead-containing solder paste, a lead-containing solder paste with organic flux, or a lead-containing solder paste without organic flux. For example, the lead-containing solder may be a tin-lead paste In forming the homogenous hybrid interconnect structure of the invention, the aligned lead free solder joint and lead-containing solder maybe heated to temperatures ranging from above 217° C. to about 260° C., and times ranging from about 2 minutes to about 4 minutes. The homogenous hybrid interconnect structure may have a configuration characterized by having no distinct regions of the lead free solder joint and the lead-containing solder.

In another aspect, the invention is directed to a method of forming an interconnection grid array structure by providing an interconnection grid array of lead free solder joints and an array of lead-containing solder. The array of lead-containing solder corresponds to the interconnection grid array of lead free solder joints. The array of lead-containing solder and the interconnection grid array of lead free solder joints are aligned and then heated. In so doing, these components are heated to a temperature above a melting point of the lead free solder joints for a sufficient time to allow for complete melting and mixing together of both the interconnection grid array of lead free solder joints and the array of lead-containing solder such that the lead from the lead-containing solder disperses throughout the interconnection grid array of lead free solder joints. This forms the homogenous hybrid interconnect grid array of the invention that has both improved and reliable levels of thermo-mechanical fatigue.

In still another aspect, the invention is directed to an assembly having an interconnection grid array that includes a first substrate joined to a second substrate via a homogenous hybrid interconnect grid array. The homogenous hybrid interconnect grid array has a plurality of hybrid solder joints. Each of these hybrid solder joints is composed of a homogenous mixture of a lead free solder and a lead-containing solder, whereby the homogenous hybrid interconnect grid array has improved, reliable levels of thermo-mechanical fatigue.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to the drawings in which like numerals refer to like features of the invention.

The present invention is directed to providing methods of forming homogenous hybrid interconnect structures, and the interconnect structures formed, that have acceptable and reliable levels of thermo-mechanical fatigue. In particular, the invention discloses homogenous hybrid interconnect structures, and methods of forming such hybrid interconnect structures using Pb-free solder joints and a Pb-containing solder for joining a substrate to an electronic circuit board. The invention requires the combination of adequate thermal energy with adequate dwell times for forming these homogenous hybrid interconnect structures.

Figure 1:
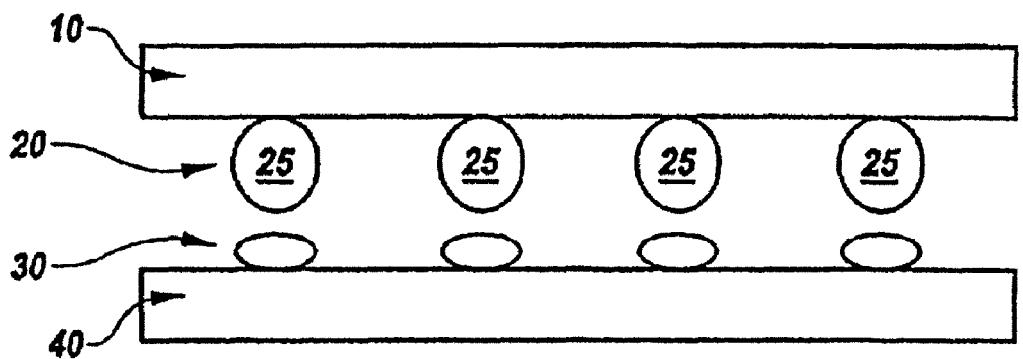
FIG. 1 illustrates a first substrate having a Pb-free solder interconnection grid array attached thereto in alignment with Pb-containing solder residing on a second substrate.

Referring to FIG. 1, a substrate 10 of an electronic module is shown having attached thereto a solder interconnection grid array 20. The solder joints 25 of the interconnection grid array are composed of Pb-free solders including, but not limited to, Sn—Ag (SA), Sn—Ag—Sb, Sn—Ag—Bi, Sn—Ag—Cu (SAC), Sn—Ag—Cu—Sb, Sn—Ag—Cu—Bi, Sn—Ag—Bi—Sb, Sn—Cu (SC), Sn—Cu—Sb, Sn—Cu—Bi, Sn—Ag—Cu—Sb—Bi and combinations thereof, which melt at temperatures ranging from about 217° C. to about 260° C. These Pb-free alloy solder compositions vary in concentrations, such as for example, Sn-3.5Ag, Sn-3.5Ag-0.7Cu, 95.5Sn-3.8Ag-0.7Cu, Sn-3.5Ag-4.8Bi, Sn-0.7Cu or some other alloy combination. Alternatively, the solder joints 25 may be composed of materials that melt at temperatures ranging from about 175° C. to about 260° C. including, but not limited to, Sn—Zn, Sn-Zi-Bi, Sn—In, Sn—Bi, Sn—Ag—In, Sn—Ag—In—Cu or combinations thereof. The Pb-free solders are preferably high melting point Pb-free solders. In accordance with the invention, the solder joints 25 may include solder ball grid arrays (BGA), solder column grid arrays, (CGA), and the like. For ease of understanding, solder BGAs are used and shown in the drawings to describe the present invention.

Once the Pb-free alloy solder joints 25 are attached to the substrate, a Pb-containing solder 30, which may be a paste with or without an organic flux, is provided on a printed circuit board 40 by known techniques in locations corresponding to where the solder joints 25 are to be joined to the board, such as on I/O pads. The Pb-containing solder 30 may be either a eutectic Pb-containing solder 30 or a non-eutectic Pb-containing solder 30. Preferably, the Pb-containing solder 30 includes, but is not limited to, a Sn/Pb paste, a eutectic Sn/Pb paste, and the like. The substrate 10 and board 40 are then aligned such that the each of the Pb-free alloy solder joints 25 are directly over and aligned to the corresponding Pb-containing solder 30 residing on the board.

Figure 2:
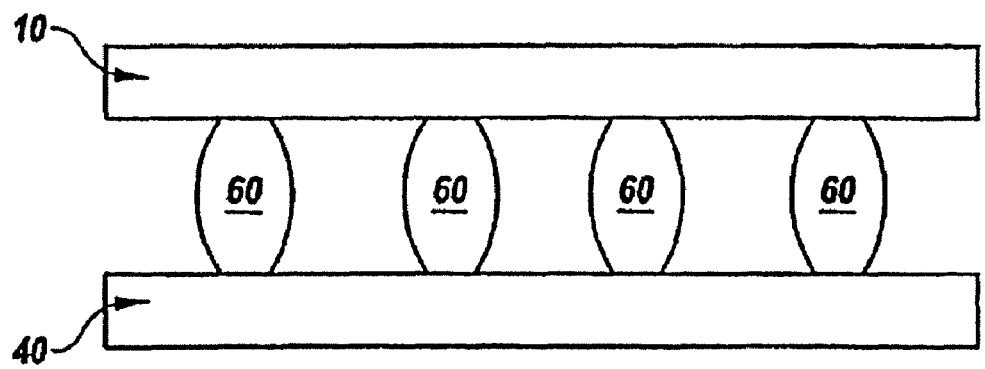
FIG. 2 illustrates the structure of FIG. 1 processed in accordance with the invention to provide a homogenous hybrid interconnect structure of the invention.

The assembly is then provided within a furnace for heating the Pb-free alloy solder joints 25 and Pb-containing solder 30 at elevated temperatures and extended times to provide the soldered assembly of the invention having hybrid interconnects with acceptable and reliable levels of thermo-mechanical fatigue. In so doing, the assembly is provided within a preheated chamber. A critical component of the invention is that the assembly is then heated at a sufficient temperature for a sufficient dwell time that allows the Pb-free alloy solder joints and the Pb-containing solder to homogenize together such that a hybrid, uniform interconnect 60 is formed, as shown in FIG. 2. In achieving the homogenized interconnect structure of the invention, an essential feature is that the assembly be heated to temperatures that are above the melting point of the Pb-free solder joints 25.

In the preferred embodiment, the assembly includes Pb-free solder balls on the substrate that are in alignment with Sn—Pb solder on a board. The assembly is provided within a furnace preheated to temperatures ranging from at least or above 217° C. to about 260° C. A critical component of the invention is that the assembly is then continuously heated at these temperatures ranging from at least or above 217° C. to about 260° C., preferably at about 220° C. to about 240° C., for a time ranging from at least or above 1 minute to about 4 minutes, preferably from about 2 minutes to about 4 minutes. Shorter dwell times may be used in accordance with the invention, such as dwell times ranging from about 30 seconds to about 1 minute, wherein the heating conditions of the processing chamber are optimal and the heating of the assembly is substantially uniform throughout. Also, temperature ranges higher than 240° C. may be used, but are ultimately dependent upon the various other components that make up the electronic assembly. For example, as temperatures above 240° C. may have disastrous effects on plastic components, it is preferred that the heating temperatures not exceed 240° C. in such instances. However, if one desires to re-qualify or replace any components destroyed during the process of heating the assembly, temperatures may exceed 240° C.

Figure 3:
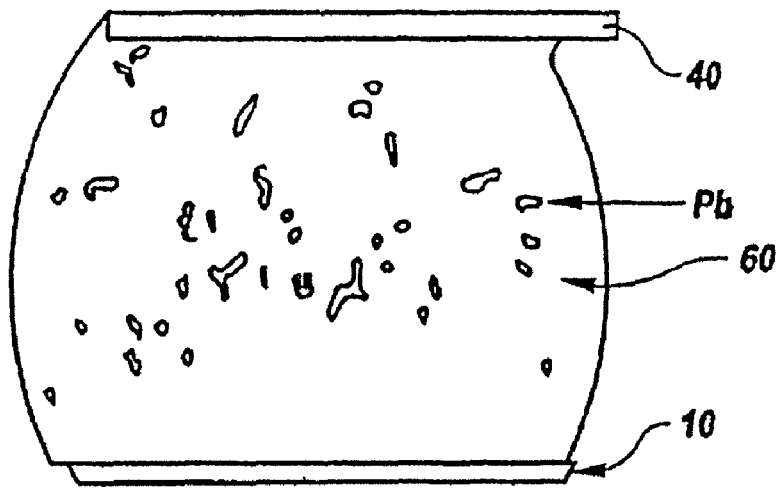
FIG. 3 illustrates an exploded view of FIG. 2 showing the homogenous hybrid interconnect structure of the invention.

Referring to FIGS. 2 and 3, in accordance with the invention, it is the combination of the higher temperatures, i.e., temperatures ranging from at least or above 217° C. to about 260° C., and longer dwell times, i.e., times ranging from above 1 minute to about 4 minutes, preferably from about 2-4 minutes, that advantageously provide the beneficial results of the invention. In particular, this combination enables the Pb-free solder and the Sn—Pb solder to completely homogenize together to provide hybrid interconnect structures 60, or joints, that no longer have apparent metallurgical separation zones between the Pb-free solder ball and Sn—Pb solder. That is, the present hybrid interconnect structures 60 are characterized by having no distinct fillets of the Sn—Pb solder or regions of the Pb-free solder ball and Sn—Pb solder. Rather, as is shown in FIGS. 2 and 3, the hybrid interconnect structures 60 are a single, uniform interconnect having a substantially oblate ellipsoid configuration. These homogenized interconnect structures have a substantially barrel-like shape with outwardly curved sides with portions of both the tops and bottoms removed to provide these hybrid interconnects with substantially flattened poles (oblate).

The final shape of the hybrid joint 60 may be manipulated by use of stand-offs, which may be placed between the substrate and the board, or by other means. However, the hybrid joint 60 will still be characterized by having no distinct fillets of the Sn/Pb solder. Rather, the joint will have a homogenized structure with no separate zones of Pb-free solder and Sn—Pb solder. Wherein the Pb-free alloy solder joints 25 comprise columns and the like, complete homogenization in accordance with the invention also results in the single, homogeneous hybrid interconnect structures 60 with substantially oblate ellipsoid shapes as shown in FIG. 2.

In achieving the oblate ellipsoid hybrid interconnect structures of the invention, it has advantageously been found that by heating the Pb-free solder interconnect and the Sn—Pb solder to temperatures just above the melting point of the Pb-free solder interconnect for sufficiently long dwell times, i.e., to at least or above 220° C. to about 240° C. for above 1 minute to about 4 minutes, preferably from about 2-4 minutes, both the Pb-free solder ball and the Pb-containing solder residing on the board are allowed to completely melting during assembly. As is shown in FIG. 3, these molten materials mix together such that the Pb from the Pb-containing solder disperses throughout substantially the entire Pb-free solder interconnect for complete homogenization of the molten materials to from the uniform hybrid interconnect structures 60 of the invention. For example, wherein the Pb-free solder interconnect joint is a 1 mm pitch SAC CBGA, with a density close to that of pure Sn, and the Pb-containing solder is a 60Sn-40Pb solder, the Pb from the 60Sn-40Pb solder disperses throughout the structure to result in a homogenous hybrid interconnect structure of the invention having about 6% by weight Pb.

Figure 4:
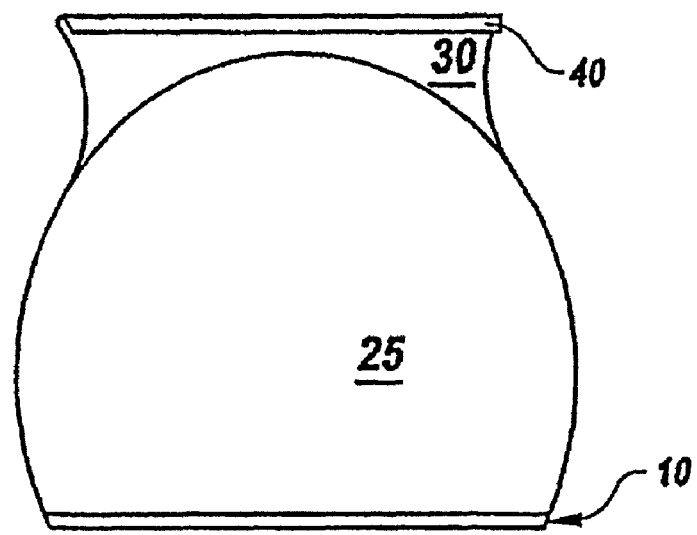
FIG. 4 is a prior art illustration showing the structure of FIG. 1 processed in accordance with conventional processing techniques to result in a prior art interconnect structure.

The single, homogeneous hybrid interconnect structures of the invention have significantly improved reliability levels under the influence of thermo-mechanical strains, as compared to the prior art structures, as shown in FIG. 4. The present homogeneous hybrid interconnect structures also discourage crack nucleation and growth at an early stage at the board side of the solder interconnection, which in turn leads to a significantly improved useful life of the electronic module, as measured by cycles to failure.

In comparison, FIG. 4 shows the results of a conventional prior art approach at joining Pb-free solder interconnects to a board using Sn—Pb paste have been dictated by the melting points of the Sn—Pb paste, and as such, are normally carried out at temperatures of about 195-215° C., typically about 205° C., for a dwell time of about 15 seconds to about 1 minute. However, at these temperatures and dwell times, only the Sn—Pb paste melts, not the Pb-free solder interconnects, such that the interconnection joints remain sufficiently tall, but with extremely poor joints characterized by unacceptable and unreliable levels of thermo-mechanical fatigue. The resultant prior art interconnect structure illustrates that, under these conventional processing conditions, apparent metallurgical separation zones or distinct fillets exist between the Pb-free solder ball and Sn—Pb solder. It is these distinct fillet zones of Sn—Pb solder that makes such an interconnect structure weak and unable to withstand stresses during thermal cycling. Further, in conventional processing, even if processing temperatures are slightly higher than 217° C. (e.g. 220° C.) at dwell times of about 15 seconds to about 75 seconds, there is no guarantee that all the joints will homogenize adequately. Incomplete homogenization results in an unreliable structure. It has now been found that processing conditions must be specified such that there is a guarantee of complete homogenization of all interconnects (joints) in the structure. This includes specific processing conditions for both heating temperatures in combination with dwell times, as is set forth in the foregoing invention.

Based on the Coffin-Manson equation a higher joint height translates to higher reliability under the influence of thermo-mechanical strain. Since it was believed that a non-melting Pb-free ball would provide a higher joint height, conventional practice has been to avoid melting of the Pb-free solder interconnect joint. The present invention has found the unexpected results that by heating these Pb-free solder interconnect joints to temperatures just above the melting point of the Pb-free material for adequate times, both the Pb-free solder and the Pb-containing paste melt, homogenize together and from a homogenous hybrid interconnect structure having significantly improved durability and reliability during performance of the electronic module.

The below experimental results show the improved results of the interconnect structures of the present invention, as shown in FIG. 2, which can achieve about 879 ATC cycles to failure at normal working condition temperatures of about 0° C. to about 100° C., as compared to the convention interconnect structures of the prior art, as shown in FIG. 4, which can only achieve about 400 ATC cycles under the same working conditions.

| Number of Samples Processed | Peak Reflow Temperature | Dwell Time Above 183° C. | Average Life (ATC) |
| --- | --- | --- | --- |
| 4 | 203° C. | 3.5 minutes | 400 cycles |
| 4 | 220° C. | 3.5 minutes | 879 cycles |

Accordingly, the present invention provides methods of making and the homogenous hybrid interconnect structures made having at least, or more than, twice the useful lifetime (fatigue life) as compared to conventional interconnect structures having a distinct fillet of Pb-containing solder attached to a Pb-free solder.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An assembly having an interconnect structure comprising:
    a first substrate;
    a second substrate; and
    a homogenous hybrid interconnect structure joining said first and second substrates, said homogenous hybrid interconnect structure comprising a hybrid solder joint composed of a homogenous mixture of a lead free solder and a lead-containing solder to form a homogenous hybrid solder joint, whereby said homogenous hybrid solder joint has improved, reliable levels of thermo-mechanical fatigue.

2. The assembly of claim 1 wherein said lead-containing solder comprises a tin-lead paste.

3. The assembly of claim 1 wherein said homogenous hybrid solder joint has a configuration characterized by having no distinct region of said lead free solder and said lead-containing solder.

4. The assembly of claim 1 wherein said lead free solder comprises a material selected from the group consisting of Sn—Ag (SA), Sn—Ag—Sb, Sn—Ag—Bi, Sn—Ag—Cu (SAC), Sn—Ag—Cu—Sb, Sn—Ag—Cu—Bi, Sn—Ag—Bi—Sb, Sn—Cu (SC), Sn—Cu—Sb, Sn—Cu—Bi, Sn—Ag—Cu—Sb—Bi or combinations thereof.

5. The assembly of claim 1 wherein said lead free solder comprises a material selected from the group consisting of Sn—Zn, Sn—Zi—Bi, Sn—In, Sn—Bi, Sn—Ag—In, Sn—Ag—In—Cu or combinations thereof.

6. The assembly of claim 1 wherein said lead-containing solder is selected from the group consisting of a lead-containing solder paste, a lead-containing solder paste with organic flux, or a lead-containing solder paste without organic flux.

7. The assembly of claim 1 wherein said homogenous hybrid solder join is configured with substantially oblate ellipsoid shape.

8. An assembly having an interconnection grid array comprising:
  a first substrate;
  a second substrate; and
  a homogenous hybrid interconnect grid array joining said first and second substrates, said homogenous hybrid interconnect grid array having a plurality of hybrid solder joints each composed of a homogenous mixture of a lead free solder and a lead-containing solder, whereby said homogenous hybrid interconnect grid array has improved, reliable levels of thermo-mechanical fatigue.

9. The assembly of claim 8 wherein said homogenous hybrid solder joints having configurations characterized by having no distinct region of said lead free solder and said lead-containing solder.

10. The assembly of claim 8 wherein said lead free solder comprises a material selected from the group consisting of Sn—Ag, Sn—Ag—Sb, Sn—Ag—Bi, Sn—Ag—Cu, Sn—Ag—Cu—Sb, Sn—Ag—Cu—Bi, Sn—Ag—Bi, Sn—Ag—Bi—Sb, Sn—Cu, Sn—Cu—Sb, Sn—Cu—Bi or combinations thereof.

11. The assembly of claim 8 wherein said lead free solder comprises a material selected from the group consisting of Sn—Zn, Sn—Zi—Bi, Sn—In, Sn—Bi, Sn—Ag—In, Sn—Ag—In—Cu or combinations thereof.

12. The assembly of claim 8 wherein said lead-containing solder is selected from the group consisting of an array of lead-containing solder paste, an array of lead-containing solder paste with organic flux, or an array of lead-containing solder paste without organic flux.

13. The assembly of claim 8 wherein said lead-containing solder comprises a tin-lead paste.

14. The assembly of claim 8 wherein said configurations of said plurality of hybrid solder joints are substantially oblate ellipsoid shapes.

15. An assembly having an interconnection grid array structure comprising:
  a first substrate;
  a second substrate; and
  a homogenous hybrid interconnect grid array joining said first and second substrates, said homogenous hybrid interconnect grid array having a plurality of hybrid solder joints being substantially oblate ellipsoid shaped and each composed of a homogenous mixture of a lead free solder and a lead-containing solder to form a homogenous hybrid interconnect grid array having improved, reliable levels of thermo-mechanical fatigue and characterized by having no distinct regions of said lead free solder joint and said lead-containing solder.

16. The assembly of claim 15 wherein said lead free solder comprises a material selected from the group consisting of Sn—Ag, Sn—Ag—Sb, Sn—Ag—Bi, Sn—Ag—Cu, Sn—Ag—Cu—Sb, Sn—Ag—Cu—Bi, Sn—Ag—Bi, Sn—Ag—Bi—Sb, Sn—Cu, Sn—Cu—Sb, Sn—Cu—Bi or combinations thereof.

17. The assembly of claim 15 wherein said lead free solder comprises a material selected from the group consisting of Sn—Zn, Sn—Zi—Bi, Sn—In, Sn—Bi, Sn—Ag—In, Sn—Ag—In—Cu or combinations thereof.

18. The assembly of claim 15 wherein said lead-containing solder is selected from the group consisting of an array of lead-containing solder paste, an array of lead-containing solder paste with organic flux, or an array of lead-containing solder paste without organic flux.

19. The assembly of claim 15 wherein said lead-containing solder comprises a tin-lead paste.

20. The assembly of claim 15 wherein a first material of the lead free solder and a second material of the lead-containing solder are dispersed throughout the plurality of hybrid solder joints to provide said homogenous hybrid interconnect grid array.

* * * * *